US012627289B2

(12) United States Patent
Miatton et al.

(10) Patent No.: US 12,627,289 B2
(45) Date of Patent: May 12, 2026

(54) CO-PACKAGED CONTROLLED OVERCURRENT HANDLING

(71) Applicant: Infineon Technologies Austria AG, Villach (AT)

(72) Inventors: Daniele Miatton, Carbonara Al Ticino (IT); Alessandro Portesan, Trovo (IT); Massimo Grasso, Trivolzio (IT); Sergio Morini, Pavia (IT)

(73) Assignee: Infineon Technologies Austria AG, Villach (AT)

( * ) Notice: Subject to any disclaimer, the term of this patent is extended or adjusted under 35 U.S.C. 154(b) by 169 days.

(21) Appl. No.: 18/521,397

(22) Filed: Nov. 28, 2023

(65) Prior Publication Data

US 2024/0204768 A1 Jun. 20, 2024

(30) Foreign Application Priority Data

Dec. 20, 2022 (EP) .................................... 22215124

(51) Int. Cl.
*H03K 17/082* (2006.01)
*G01R 19/165* (2006.01)
(Continued)

(52) U.S. Cl.
CPC ... *H03K 17/0826* (2013.01); *G01R 19/16504* (2013.01); *G01R 19/16533* (2013.01); *H02H 9/02* (2013.01); *H03K 2017/0806* (2013.01)

(58) Field of Classification Search
CPC .............. H03K 17/082; H03K 17/0826; H03K 2017/0806; H03K 17/145; H03K 17/163;
(Continued)

(56) References Cited

U.S. PATENT DOCUMENTS 6,307,726 B1 10/2001 Marshall et al.
2008/0232017 A1* 9/2008 Nakajima .............. H03K 17/74
361/93.7
(Continued)

FOREIGN PATENT DOCUMENTS

EP 2560283 A1 2/2013
EP 2980994 A1 2/2016
EP 3958467 A1 2/2022

OTHER PUBLICATIONS

Wiesner, Eugen, et al., "Advanced protection for large current full SiC-modules," PCIM Europe, May 2016, VDE, Nuremberg, Germany, pp. 48-52.

*Primary Examiner* — Danny Nguyen
(74) *Attorney, Agent, or Firm* — Harrity & Harrity, LLP

(57) ABSTRACT

The application relates to co-packaged controlled overcurrent handling of a power switch assembly. The power switch assembly includes a power switch and an overcurrent handling logic. The overcurrent handling logic includes an overcurrent detection circuit configured to detect an overcurrent condition of a load current of the power switch and to provide an overcurrent detection signal indicative of an overcurrent condition of the load current of the power switch and a discharge current generation circuit coupled to the overcurrent detection circuit, and configured to generate a discharge current to at least partially discharge a control terminal of the power switch responsive to the overcurrent detection signal.

17 Claims, 8 Drawing Sheets

(51) Int. Cl.
*H02H 9/02* (2006.01)
*H03K 17/08* (2006.01)

(58) Field of Classification Search
CPC ........... H03K 17/0822; H03K 17/0812; H03K
17/14; G01R 19/165; G01R 19/16504;
G01R 19/16533; H02H 9/02
USPC ................................................ 361/93.7–93.9
See application file for complete search history.

(56) References Cited

U.S. PATENT DOCUMENTS

| | | | |
|---|---|---|---|
| 2010/0134939 A1* | 6/2010 | Takahashi | H03K 17/0822<br>361/87 |
| 2010/0244800 A1* | 9/2010 | Nakamura | H02M 1/32<br>323/284 |
| 2015/0256070 A1* | 9/2015 | Lee | H02P 27/08<br>323/283 |
| 2015/0311692 A1 | 10/2015 | Hiyama | |
| 2015/0346245 A1 | 12/2015 | Kiep et al. | |
| 2016/0211657 A1* | 7/2016 | Hayashi | H03K 17/0828 |
| 2019/0280686 A1 | 9/2019 | Lu et al. | |
| 2023/0170893 A1* | 6/2023 | Takuma | H03K 17/0822<br>361/93.9 |

* cited by examiner

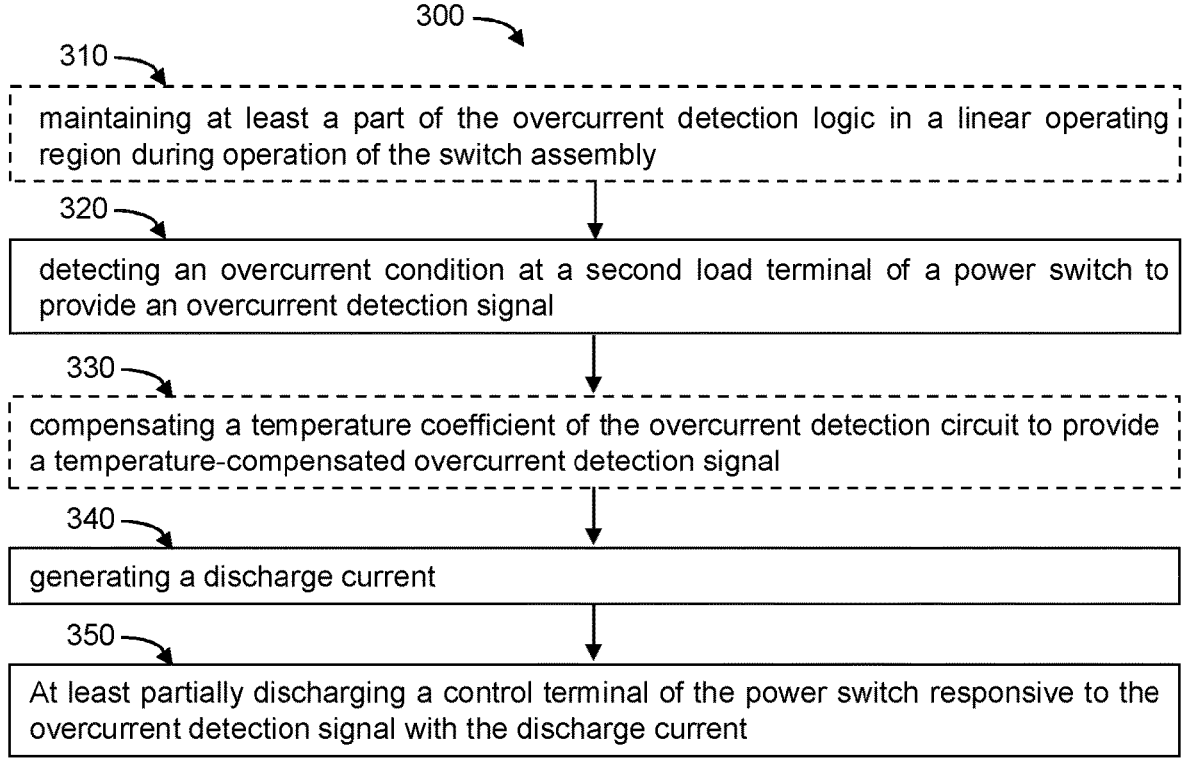

300 ⟍

310 ⟍ maintaining at least a part of the overcurrent detection logic in a linear operating region during operation of the switch assembly

320 ⟍ detecting an overcurrent condition at a second load terminal of a power switch to provide an overcurrent detection signal

330 ⟍ compensating a temperature coefficient of the overcurrent detection circuit to provide a temperature-compensated overcurrent detection signal

340 ⟍ generating a discharge current

350 ⟍

At least partially discharging a control terminal of the power switch responsive to the overcurrent detection signal with the discharge current

Fig. 9

CO-PACKAGED CONTROLLED OVERCURRENT HANDLING

CROSS-REFERENCE TO RELATED APPLICATION

This application claims priority to European Patent Application No. 22215124 filed on Dec. 20, 2022, the content of which is incorporated by reference herein in its entirety.

TECHNICAL FIELD

The implementation generally relates to overcurrent protection of power switches and more precisely to overcurrent protection provided inside a power switch assembly.

BACKGROUND

During operation, a power switch may encounter abnormally high load path currents, e.g., overcurrent or short circuit conditions, which can damage the power switch. To avoid damage to the power switch, various solutions external to and co-packaged with the power switch exist, which detect an overcurrent and turn off the power switch. Given the switching speed of modern power switches, the timeframe to detect an overcurrent can be very short so that high-speed detection logic must be used.

In addition, present overcurrent detection handling solutions do not consider parasitic inductances in series with the load path of the power switch. Depending on the speed and the level to which the load current is reduced following detection of an overcurrent, such parasitic inductances may cause voltage surges at the power switch, which may inadvertently damage the power switch.

Therefore, it is an objective of the present implementation to improve the protection of power switches with regard to overcurrent or short-circuit conditions.

SUMMARY

To achieve this objective, the present implementation provides a power switch assembly having an assembly control terminal, a first assembly load terminal and a second assembly load terminal, including a power switch having a control terminal coupled to the assembly control terminal, a first load terminal coupled to the first assembly load terminal and a second load terminal coupled to the second assembly load terminal and an overcurrent handling logic coupled between the assembly control terminal and the control terminal and between the second load terminal and the second assembly load terminal, including an overcurrent detection circuit coupled between the second load terminal and the second assembly load terminal and configured to detect an overcurrent of a load current of the power switch, and a discharge current generation circuit coupled to the overcurrent detection circuit, the control terminal and the second load terminal and configured to generate a discharge current to at least partially discharge the control terminal responsive to the temperature-compensated overcurrent detection signal.

The present implementation further provides a method for operating an overcurrent handling logic of a power switch assembly, the overcurrent handling logic including an overcurrent detection logic and a discharge current generation circuit, the method including detecting an overcurrent at a load a second load terminal of a power switch of the power switch assembly, generating a discharge current and at least partially discharging a control terminal of the power switch responsive to the overcurrent detection signal with the discharge current.

BRIEF DESCRIPTION OF THE DRAWINGS

Implementations of the present implementation will be described with reference to the following appended drawings, in which like reference signs refer to like elements.

FIG. 9 provides a flowchart of a method for operating an overcurrent handling logic of the power switch assembly according to implementations of the present implementation.

It should be understood that the above-identified drawings are in no way meant to limit the disclosure of the present implementation. Rather, these drawings are provided to assist in understanding the implementation. The person skilled in the art will readily understand that aspects of the present implementation shown in one drawing may be combined with aspects in another drawing or may be omitted without departing from the scope of the present implementation.

DETAILED DESCRIPTION

The present disclosure generally provides a power switch assembly which includes a power switch and an overcurrent handling logic. The overcurrent handling logic is configured to detect an overcurrent through a load path of the power switch and to generate a discharge current. The discharge current at least partially discharges, in response to the overcurrent detection, a control terminal of the power switch. The discharge current is configured to quickly cause a reduction of the load current to a safe value while not discharging the control terminal too quickly to cause a voltage surge at parasitic inductances coupled in series with the power switch. Further, to avoid erroneous overcurrent detections, an overcurrent detection circuit of the overcurrent handling logic may be temperature-compensated, e.g., the overcurrent detection may be configured to compensate a temperature coefficient of at least a part of the overcurrent detection circuit. Since the temperature compensation is not to impact the detection speed, at least a part of the overcurrent detection may be maintained in a linear operating region. This enables fast detection of an overcurrent while at the same time enabling compensation of a temperature coefficient of at least a part of the overcurrent detection circuit.

Figure 1:
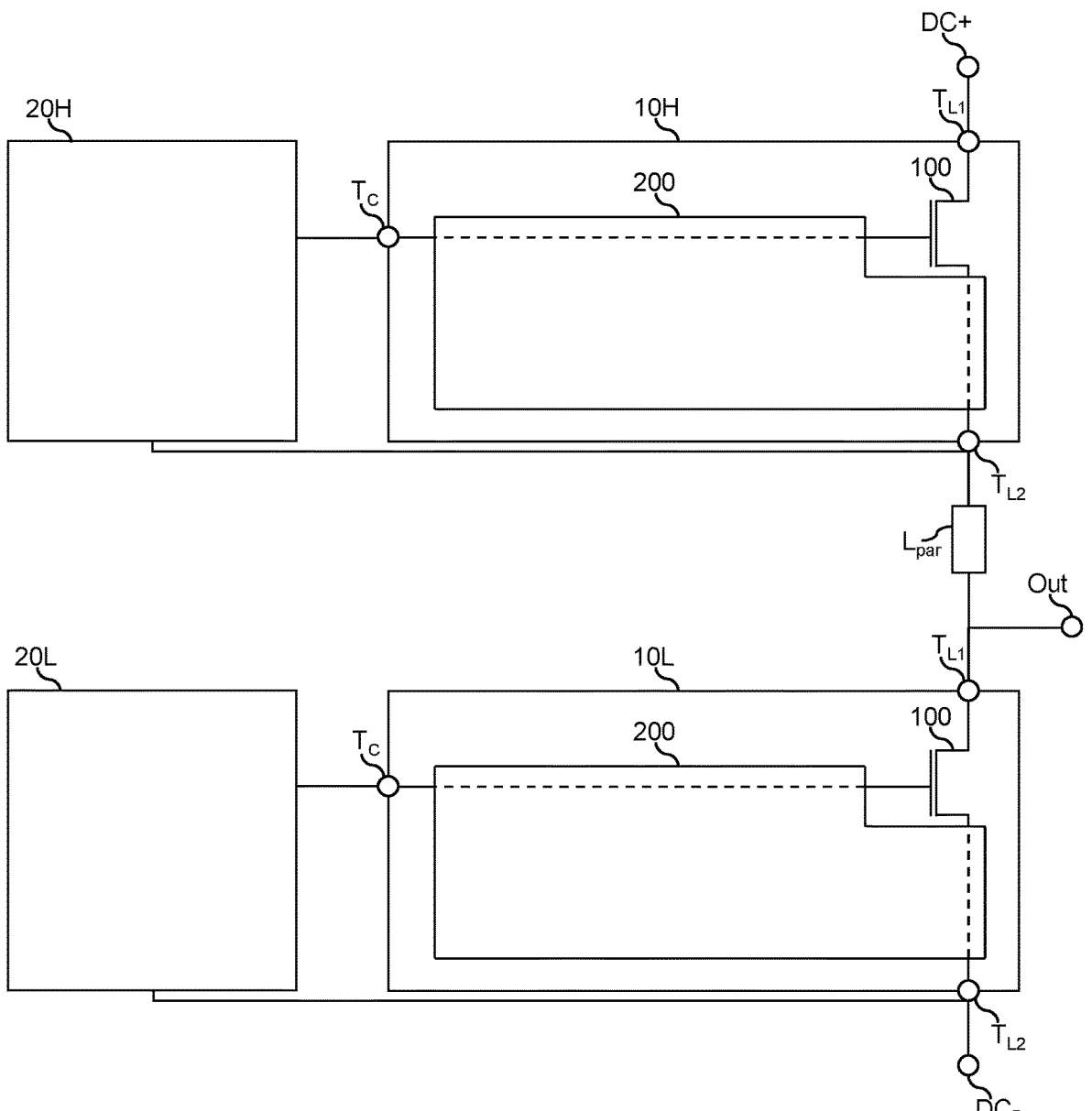
FIG. 1 illustrates a half-bridge topology including power switch assemblies according to implementations of the present implementation.

This general concept will be explained with reference to the appended drawings with FIG. 1 illustrating a typical application of the power switch assembly and FIG. 2 providing a block diagram of the power switch assembly. Based on the block diagram of FIG. 2, various example implementation details of the blocks of the power switch assembly will be described in detail with regard to FIGS. 3 to 8, moving from left to right through FIG. 2. Finally, FIG. 9 will provide a flow chart of the method performed by the overcurrent handling logic of the power switch assembly.

FIG. 1 schematically illustrates a half-bridge topology formed by power switch assemblies 10H and 10L. High side power switch assembly 10H is coupled between a supply voltage DC+ and an output of the half-bridge, while low side power switch assembly 10L is coupled between the output of the half bridge and a supply voltage DC−. The half-bridge further includes parasitic inductances in series with power switch assemblies 10H and 10L, which may be due to wires or other conductors that are used to electrically couple the components and that carry the load current. To illustrate these parasitic inductances, an example parasitic inductance $L_{par}$ is shown between high-side switch assembly 10H and the output of the half-bridge. It will be understood that parasitic inductances may be also present between the output of the half-bridge and the low side switching assembly or between the respective switching assemblies and the supply voltages DC+ and DC−. $L_{par}$ may thus also be considered as the equivalent inductance of all parasitic inductances of the half-bridge.

Power switch assemblies 10H and 10L are respectively coupled to gate drivers 20H and 20L. Gate drivers 20H and 20L may be any kind of gate driver configured to provide a control signal to a control terminal of a power switch. To this end, gate drivers 20H and 20L may for example be inverters coupled between a high logic supply voltage and a low logic supply voltage and configured to provide either one of the two logic supply voltages at an output of gate drivers 20H and 20L. The high logic supply voltage may be a voltage level higher than the threshold voltage of power switch 10. In a further example, gate drivers 20H and 20L may include individually controlled switches coupling either one of the two logic supply voltages to the output of gate drivers 20H and 20L. It will be understood that gate drivers 20H and 20L need not be identical in structure. Rather, given the different requirements for a high side gate driver and a low side gate driver, gate drivers 20H and 20L may be specially adapted to these different requirements and may thus differ in structure. Also, in some examples, gate drivers 20H and 20L may form a single half-bridge gate driver controlling both power switch assemblies 10H and 10L.

Finally, each one of the power switch assemblies 10H and 10L includes a power switch 100 and an overcurrent handling logic 200, which will be discussed in detail with regard to FIG. 2. We note that the switches 100 of the power switch assemblies 10H and 10L may be the same or may be different to each other.

Figure 2:
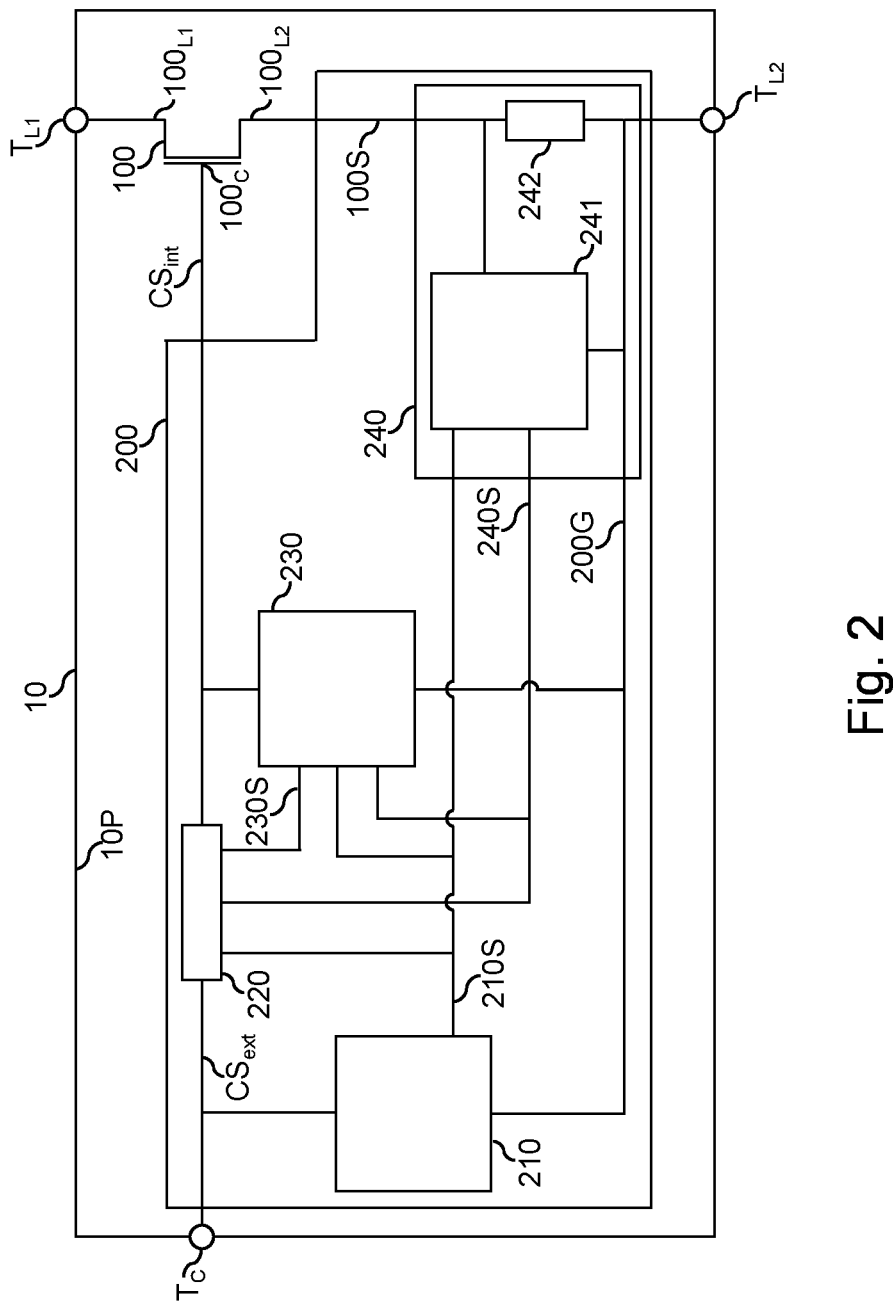
FIG. 2 provides a block diagram of the power switch assembly according to implementations of the present implementation.

FIG. 2 provides a block diagram of a power switch assembly 10, which is an example of the power switch assemblies 10H and 10L of FIG. 1. Thus, power switch assembly 10 includes power switch 100 and overcurrent handling logic 200.

Power switch assembly 10 has an assembly control terminal $T_C$, a first assembly load terminal $T_{L1}$ and a second assembly load terminal $T_{L2}$. Assembly control terminal $T_C$, first assembly load terminal $T_{L1}$ and second assembly load terminal $T_{L2}$ may be comprised in a package 10P. Package 10P may thus enclose power switch 100 and overcurrent logic 200.

Power switch 100 has a control terminal $100_C$, a first load terminal $100_{L1}$ and a second load terminal $100_{L2}$. These terminals are respectively coupled to assembly control terminal $T_C$, first assembly load terminal $T_{L1}$ and second assembly load terminal $T_{L2}$. As can be seen in FIG. 2 and as will be understood throughout this disclosure, the expression "coupled" refers to both direct connections and connections with intervening elements, the latter being the case for control terminal $100_C$, first load terminal $100_{L1}$ and second load terminal $100_{L2}$ and assembly control terminal $T_C$, first assembly load terminal $T_{L1}$ and second assembly load terminal $T_{L2}$, respectively.

Power switch 100 may be any kind of power switch configured to have a high voltage blocking capability. For example, power switch 100 may be able to block voltages above at least 400V, such as 450V, 900V, 1200V or 1800V. To achieve such voltage blocking capabilities, power switch 10 may for example be a silicon or silicon carbide (SiC) metal oxide field effect transistor (MOSFET), a silicon or SiC insulated gate bipolar transistor (IGBT) or a Gallium nitride high electron mobility transistor (GaN-HEMT). It will be understood that both the voltage levels and the technology types discussed with regard to power switch 10 are merely provided as an example. The present disclosure may be practiced with other high voltage levels and other power switch technologies than those mentioned here.

Power switch 100 may, in some implementations of the present disclosure, include current sense capability. That is, power switch 100 may be configured to provide a signal indicative of a load current $I_L$ of power switch 100, e.g., the current flowing between first load terminal $100_{L1}$ and second load terminal $100_{L2}$, to overcurrent handling logic 200, for example. The current sense capability may for example be implemented by branching off a current flowing through some of the transistor cells forming power switch 100, such as 1 or 10 transistor cells. It will be understood that the current sense capability may also be provided in other ways and that in some examples of the present disclosure the current sense capability may not be present. For example, in some examples of the present disclosure, load current may be directly used to detect an overcurrent condition.

Overcurrent handling logic 200 is coupled between assembly control terminal $T_C$ and control terminal $100_C$ as well as between second load terminal $100_{L2}$ and second assembly load terminal $T_{L2}$. Within overcurrent handling logic 200, assembly control terminal $T_C$ may be coupled to an external control signal line $CS_{ext}$, control terminal $100_C$ may be coupled to an internal control signal line $CS_{int}$, second load terminal $100_{L2}$ may be coupled to a load current signal line 100S and second assembly load terminal $T_{L2}$ may be coupled to a ground signal line 200G.

Based on the arrangement between control terminal $100_C$ and assembly control terminal $T_C$ as well as between second load terminal $100_{L2}$ and second assembly load terminal $T_{L2}$, overcurrent detection circuit 200 is configured to detect an overcurrent condition of load current $I_L$ and to handle, e.g., to control, a voltage $V_{CL2}$ between control terminal $100_C$ and second load terminal $100_{L2}$. As will be discussed in the following, overcurrent handling logic 200 can further be configured to detect the overcurrent condition in a tempera-ture-compensated manner and further controls voltage $V_{CL2}$ and thereby load current IL in a way which avoids voltage surges at power switch 100 at parasitic inductances, such as parasitic inductance $L_{par}$.

Overcurrent handling logic 200 includes an overcurrent detection circuit 240 and a discharge current generation circuit 230. Overcurrent handling logic 200 may further comprise a power supply generation circuit 210 and a control path control circuit 220. The various circuits of overcurrent handling logic 200 will be discussed in the following.

Power supply generation circuit 210 may be configured to generate a power supply for at least one of overcurrent detection circuit 240, discharge current generation circuit 230 and control path control circuit 220 based on a voltage supplied by a gate driver, such as gate drivers 20H and 20L of FIG. 1, coupled to assembly control terminal $T_C$ and second assembly load terminal $T_{L2}$. To this end, power supply generation circuit 210 may be coupled between external control signal line $CS_{ex}$t and ground signal line 200G. In other words, power supply generation circuit 210 uses a voltage difference between external control signal line $CS_{ext}$ and ground signal line 200G generated by an external gate driver to provide a power supply to components of overcurrent handling logic 200. Power supply generation circuit 210 may provide the generated power supply to the components of overcurrent handling logic 200 via power supply line 210S.

Basing the generation of the power supply voltage of overcurrent handling logic 200 on the above-discussed volt-age difference may ensure that power switch assembly 10 appears as a regular power switch when looking at the pin-out of power switch assembly 10, e.g., power switch assembly 10 has a pin-out like a power switch without any logic co-packaged with it. Further, such an arrangement may ensure that the internal control provided by overcurrent handling logic 200 cannot turn on power switch 100 if a gate driver controlling power switch assembly 10 provides a turn-off signal to power switch assembly 10.

Figure 3:
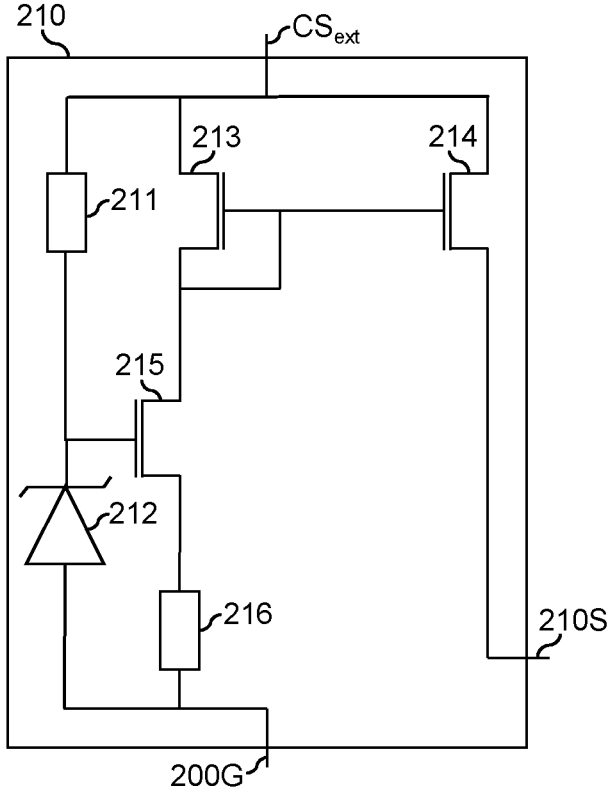
FIG. 3 illustrates an example power supply of the overcurrent handling logic according to implementations of the present implementation.

One example implementation of power supply generation circuit 210 according to the present disclosure is shown in FIG. 3. Accordingly, power supply generation circuit 210 may include a resistor 211, a Zener diode 212, three tran-sistors 213 to 215 and a resistor 216. Resistor 211, Zener diode 212, transistor 215 and resistor 216 are configured to generate a current based on the voltage difference between signal line $CS_{ext}$ and 200G. This current is then mirrored to power supply line 210S by a current mirror formed by transistors 213 and 214. The current mirror formed by transistors 213 and 214 may be used to amplify the current resistor 211, Zener diode 212, transistor 215 and resistor 216 if a gain of the current mirror formed by transistors 213 and 214 is larger than 1. This may for example be achieved by designing transistors 213 and 214 with different transistor parameters or by implementing transistors 213 and 214 as multiple transistors with identical transistor parameters respectively in parallel but with different numbers of parallel transistors.

It will be understood that in some example implementa-tions of overcurrent handling logic 200, the functionality of power supply generation circuit 210 may be integrated into at least one of overcurrent detection circuit 240, discharge current generation circuit 230 and control path control circuit 220. That is, in such example implementations, overcurrent handling logic 200 may not include power supply generation circuit 210. Instead, overcurrent detection circuit 240, discharge current generation circuit 230 and control path control circuit 220 may in such example imple-mentations implement their individual power supplies based on the voltage difference between control signal line $CS_{ext}$ and ground signal line 200G. Also, in some example imple-mentations of overcurrent handling logic 200, overcurrent detection circuit 240, discharge current generation circuit 230 and control path control circuit 220 may not require a power supply and may be operated based on the detection of an overcurrent condition of load current $I_L$. In other words, in such example implementations, an overcurrent detection signal 240S, which will be discussed later, may provide the power to operate overcurrent detection circuit 240, dis-charge current generation circuit 230 and control path con-trol circuit 220. It will further be understood that both approaches, e.g., providing operating power to the compo-nents of overcurrent handling logic 200 based on the voltage difference between control signal line $CS_{ext}$ and ground signal line 200G and based on the load current $I_L$ may be mixed. That is, in some example implementations, some components of overcurrent handling logic 200 may be supplied by one of power supply generation circuit 210 or internal power supply and some components may be sup-plied by overcurrent detection signal 240S.

Control path control circuit 220 may be coupled between assembly control terminal $T_C$ and control terminal $100_C$ and may be configured to switchably couple assembly control terminal $T_C$ to control terminal $100_C$. In the context of the present disclosure, switchably coupling may refer to the fact that control path control circuit 220 may be configured to switch between a variety of coupling states, which may for example include a decoupling state and a coupling state. In the decoupling state, control path control circuit 220 may provide a high impedance between assembly control termi-nal $T_C$ and control terminal $100_C$ while at the same time enabling sinking of a current from control terminal $100_C$ to assembly control terminal $T_C$. In the coupling state, control path control circuit 220 may provide a low impedance between assembly control terminal $T_C$ and control terminal $100_C$, thereby enabling control of the control terminal $100_C$ via external control signal line $CS_{ext}$. In other words, control path control circuit 220 may switchably couple external control signal line $CS_{ext}$ to internal control signal line $CS_{in}$. Control path control circuit 220 may thereby enable over-current handling logic 200 to switch between external con-trol via an external gate driver and internal control via overcurrent handling logic 200 following the detection of an overcurrent condition. Therefore, control path control circuit 220 may in some implementations be configured to decouple assembly control terminal $T_C$ from control terminal $100_C$ responsive to overcurrent detection signal 240S.

Control path control circuit 220 may further be configured to keep (maintain) assembly control terminal $T_C$ and thus external control signal line $CS_{ext}$ decoupled from control terminal $100_C$ (and thus internal control signal line $CS_{int}$) until a voltage supplied by an external gate driver coupled to assembly control terminal $T_C$ and second assembly load terminal $T_{L2}$ falls below a threshold voltage of power switch 100 and/or until another predefined condition is met, such as when the detected overcurrent condition has passed. That is, control path control circuit 220 may keep (maintain) power switch assembly 10 in an internal control state until an external gate driver stops to supply a turn-on signal to power switch assembly 10.

Figure 4:
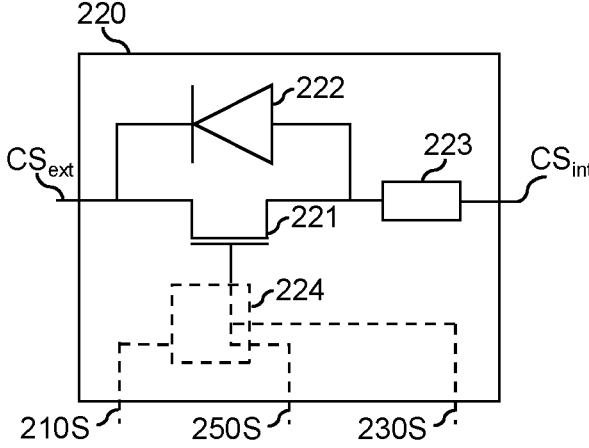
FIG. 4 illustrates an example control path control circuit of the power switch assembly according to implementations of the present implementation.

One example implementation of control path control circuit 220 according to the present disclosure is shown in FIG. 4. Accordingly, control path control circuit 220 may include a control path switch 221, a diode 222, a resistor 223 and a gate driver 224.

Control path switch 221 may, based on one of a signal from gate driver 224, control path modulation signal 230S or overcurrent detection signal 240S, switchably couple external control signal line $CS_{ext}$ to internal control signal line $CS_{int}$.

Gate driver 224 may be a gate driver similar to gate drivers 20H and 20L and may be configured to couple control path switch 221 to a voltage level causing control path switch 221 to be in a conductive state and to a voltage level causing control path switch 221 to be in a blocking state based on overcurrent detection signal 240S. These voltage level may for example correspond to power supply line 210S and to ground signal line 200G or may be derived by gate driver 224 from power supply line 210S and from ground signal line 200G (connection to ground signal line 200G not shown in FIGS. 2 and 4 for simplicity).

Alternatively, control path switch 221 may be directly coupled to overcurrent detection signal 240S in a manner ensuring that control path switch 221 decouples external control signal line $CS_{ext}$ from internal control signal line $CS_{int}$ if overcurrent detection signal 240S indicates an overcurrent condition. To this end, control path switch 221 may for example be a normally-on device or overcurrent detection signal 240S may be invertedly provided to control path switch 221. Further, control path switch 221 may receive control path modulation signal 230S determined by overcurrent detection circuit 240, which will be discussed below. Accordingly, in some implementations of the present disclosure, control path control circuit 220 may be controlled by overcurrent detection circuit 240.

Resistor 223 may, if control path switch 221 couples external control signal line $CS_{ext}$ to internal control signal line $CS_{int}$, provide a current to control terminal $100_C$ based on the voltage applied by an external gate driver at assembly control terminal $T_C$.

Diode 222 is coupled in parallel with control path switch 221. The cathode of diode 222 is coupled to external control signal line $CS_{ext}$ and the anode of diode 222 is coupled to internal control signal line $CS_{int}$. Accordingly, diode 222 is reverse biased while an external gate driver applies a voltage to assembly control terminal $T_C$ exceeding the voltage level of internal control signal line $CS_{int}$. However, diode 222 may become forward biased and thus conductive if an external gate driver pulls a voltage applied at assembly control terminal $T_C$ below the voltage level of internal control signal line $CS_{int}$. Based on this arrangement of diode 222, diode 222 may provide a path to sink current from control terminal $100_C$ if an external gate driver indicates that power switch assembly should be turned into a blocking state. This may expedite switching power switch 100 to the blocking state. Diode 222 may be a body diode of control path switch 221 or may be a freewheeling diode provided with control path switch 221. It will be understood that diode 222 may be omitted in implementations of the present disclosure which do not require the current sinking functionality provided by diode 222.

Discharge current generation circuit 230 is coupled to overcurrent detection circuit 240, control terminal $100_C$ and second load terminal $100_{L2}$ via ground signal line 200G. Based on this arrangement, discharge current generation circuit 230 is configured to generate a discharge current $I_{dis}$ to at least partially discharge control terminal $100_C$ responsive to overcurrent detection signal 240S. In other words, discharge current generation circuit 230 at least partially discharges control terminal 100. For example, discharge current generation circuit 230 may at least partially discharge a capacitance of power switch 100 at control terminal 100, by providing the discharge current $I_{dis}$, which flows from control terminal $100_C$ to second load terminal $100_{L2}$.

The discharge current $I_{dis}$ may be based on a fall time $t_{fall}$, wherein fall time $t_{fall}$ defines a timeframe from the detection of the overcurrent condition of load current $I_L$ to a reduction of the load current $I_L$ to a safety current value $I_{safe}$. Safety current value $I_{safe}$ may for example correspond to a safety voltage level $V_{safe}$ of voltage $V_{CL2}$. That is, timeframe $t_{fall}$ approximately determines a rate of change over time of load current $I_L$. While this changing of load current $I_L$ may lead to a voltage surge due to parasitic inductance $L_{par}$, timeframe $t_{fall}$ is determined such that such voltage surge is acceptable in light of a maximum blocking voltage of power switch 100. In other words, for a given application, fall time $t_{fall}$ is determined based on a difference between the load current $I_L$ and safety current value $I_{safe}$ and based on the parasitic inductance $L_{par}$ and maximum blocking voltage of the power switch 100, such that a voltage across the first load terminal $100_{L1}$ and second load terminal $100_{L2}$ of the power switch 100, including a voltage surge caused by a change of the load current $I_L$, does not exceed the maximum blocking voltage of the power switch 100. This will be discussed in more detail in the following with regard to the upper signaling diagram of FIG. 6.

Figure 6:
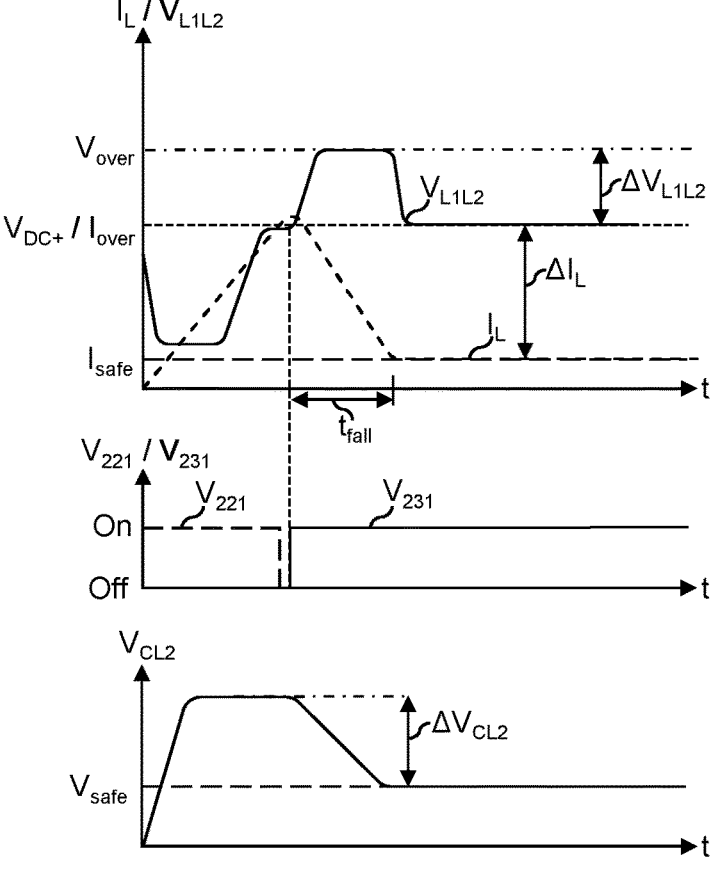
FIG. 6 illustrates various signals illustrating the operation of the discharge current generation circuit of the power switch assembly according to implementations of the present implementation.

The upper signaling diagram of FIG. 6 illustrates load current $I_L$ and a voltage $V_{L1L2}$ between first load terminal $100_{L1}$ and second load terminal $100_{L2}$ over time with regard to signal value levels $I_{safe}$, $I_{over}$, $V_{DC+}$ and $V_{over}$. As can be seen, load current $I_L$ increases to overcurrent detection level $I_{over}$, at which point overcurrent detection circuit 240 detects the overcurrent condition of load current $I_L$. Accordingly, overcurrent detection circuit 240 provides overcurrent detection signal 240S. In response to overcurrent detection signal 240S, discharge current generation circuit 230 provides the discharge current $I_{dis}$, which causes load current $I_L$ to be reduced from overcurrent current level $I_{over}$ to safety current level $I_{safe}$ during fall time $t_{fall}$. The reduction of load current $I_L$ from overcurrent current level $I_{over}$ to safety current level $I_{safe}$ may be referred to as $\Delta I_L$. At the same time, voltage $V_{L1L2}$ increases above $V_{DC+}$, e.g., the high voltage supply coupled to power switch assembly 10, to overcurrent voltage level $V_{over}$. This increase is due to a voltage surge induced by parasitic inductance $L_{par}$, which is a result of overcurrent handling logic 200 discharging control terminal $100_C$ after detecting the overcurrent condition. Since parasitic inductance $L_{par}$ is coupled in series with power switch 10, as shown in FIG. 1, the voltage $V_{Lpar}$ at parasitic inductance $L_{par}$ can be determined as shown in equation (1) below:

$$V_{L_{par}} = L_{par} * \frac{dI_L}{dt}. \qquad \text{equation (1)}$$

In equation (1), $$\frac{dI_L}{dt}$$

represents the rate of change of the load current. As can be seen from equation (1), the rate of change of the load current leads to a voltage surge, which increases the voltage at first load terminal $100_{L1}$ from voltage level $V_{DC+}$ to voltage level $V_{over}$ and thus increases voltage $V_{L1L2}$. In FIG. 6, the voltage surge is accordingly indicated by voltage difference $\Delta V_{L1L2}$.

As can be seen in the upper signaling diagram of FIG. 6, the discharge current $I_{dis}$ at least partially discharges control terminal $100_C$ until load current $I_L$ has reached safety load current value $I_{safe}$. Safety load current value $I_{safe}$ may be a current value above 0 A but below a rated nominal current $I_{nom}$ of power switch 100 and may be selected based on the specific application in which the power switch assembly is to be employed. In other words, the discharge current $I_{dis}$ discharges the control terminal $100_C$, for example a capacitance at control terminal $100_C$, to a charge level corresponding to safety load current value $I_{safe}$. Since safety load current value $I_{safe}$ may be a current value above 0 A, as shown in the upper signaling diagram of FIG. 6, the discharge current may not fully discharge control terminal $100_C$, for example the discharge current $I_{dis}$ may only partially discharge control terminal $100_C$. It will be understood that based on the implementation of power switch assembly 10, safety load current value $I_{safe}$ may in some implementations be 0 A, in which case the discharge current $I_{dis}$ fully discharges control terminal $100_C$.

The lower signaling diagram of FIG. 6 illustrates a voltage $V_{CL2}$ over time, e.g., the voltage between control terminal $100_C$ and $100_{L2}$. As the time axes of the upper signaling diagram and the lower signaling diagram of FIG. 6 are aligned, it can be seen that the reduction of load current $I_L$ during fall time $t_{fa}$u also leads to a reduction of voltage $V_{CL2}$ to safety voltage level $V_{safe}$ by a voltage difference $\Delta V_{CL2}$.

As can be seen from the above discussion of the upper signaling diagram of FIG. 6, fall time $t_{fall}$ needs to be determined based on the size of parasitic inductance $L_{par}$, the maximum permissible overcurrent voltage level $V_{over}$ in light of the maximum breakdown voltage of power switch 100 and the safety load current value $I_{safe}$. Accordingly, fall time $t_{fall}$ may be determined as shown in equation (2):

$$t_{fall} = L_{par} \frac{\Delta I_L}{V_{over} - V_{DC+}}. \qquad \text{equation (2)}$$

This equation is derived from equation (1) relating to the voltage at parasitic inductance $L_{par}$ and the parameters discussed with regard to the upper signaling diagram of FIG. 6.

$\Delta I_L$ may also be expressed by the load current density $\Delta J_L$ having the unit A/mm², which is a technology parameter of power switch 100. Accordingly, equation (2) can also be expressed based on the area $A_a$ of power switch 100 as shown in equation (3):

$$t_{fall} = L_{par} \frac{\Delta J_L * A_a}{\Delta V_{L1L2}}. \qquad \text{equation (3)}$$

The discharge current $I_{dis}$ of power switch 100 may generally be approximated as shown in equation (4):

$$I_{dis} = g_m * \Delta V_{CL2}. \qquad \text{equation (4)}$$

In the above equation, $g_m$ denotes the transconductance of power switch 100, which may be determined according to equation (5):

$$g_m = \frac{C_{100_c}}{t_{fall}}. \qquad \text{equation (5)}$$

In other words, transconductance $g_m$ may be determined by dividing the capacitance $C_{100C}$ of control terminal $100_C$ by the fall time tai. Therefore, the discharge current $I_{dis}$ may be calculated according to equation (6), which is based on equations (4) and (5):

$$I_{dis} = C_{100_c} \frac{\Delta V_{CL2}}{t_{fall}}. \qquad \text{equation (6)}$$

Since the capacitance $C_{100C}$ of control terminal $100_C$ can be expressed as the product of a control terminal capacitance density $c_{100C,u}$, e.g., a technology parameter of power switch 100, and the area $A_a$ of power switch 100, the discharge current $I_{dis}$ can be calculated by replacing capacitance $C_{100C}$ in equation (6) as shown in equation (7):

$$I_{dis} = c_{100_c,u} * A_a * \frac{\Delta V_{CL2}}{t_{fall}}. \qquad \text{equation (7)}$$

Finally, inserting equation (3) for fall time $t_{fall}$ in the above equation for the discharge current $I_{dis}$ leads to the equation (8):

$$I_{dis} = \frac{c_{100_c,u}}{\Delta J_L} * \frac{\Delta V_{CL2} * \Delta V_{L1L2}}{L_{par}}. \qquad \text{equation (8)}$$

As can be seen, area $A_a$ of power switch 100 cancels out. The discharge current $I_{dis}$ can thus be determined independent of the area of power switch 100. Thus, based on the fall time $t_{fall}$, technology parameters of power switch 100 and parasitic inductance $L_{par}$, a current value of the discharge current $I_{dis}$ can be determined, which quickly discharges control terminal $100_C$ while avoiding voltage levels of overcurrent voltage $V_{over}$ which exceed the breakdown voltage of power switch 100. Note that the value $I_{dis}$ determined using equation (8) represents a maximum value for a given parasitic inductance $L_{par}$ value to achieve fastest discharge of control terminal $100_C$ under the noted boundary conditions, and a lower value of $I_{dis}$ may be used to account for variations of the parameters entering into equation (8) to provide for a safety margin, for example. All parameters necessary to determine the discharge current $I_{dis}$ can be determined based on safety voltage level $V_{safe}$, safety current value $I_{safe}$, technology parameters of power switch 100 and an approximation of parasitic inductance $L_{par}$, for example based on the traces on a printed circuit board on which power switch assembly 10 is placed. Discharge current $I_{dis}$ may for example be an essentially constant current having, as an upper limit, a value that is determined based on equation (8) above. "Essentially constant" is to be construed, in this case, as a current that does not drop more than up to a maximum predetermined fraction, for example up to 10%, up to 20%, up to 30%, up to 40%, or up to 50%, below a nominal value of discharge current $I_{dis}$, excluding switching on or switching off transitions of the discharge current. In implementations, discharge current $I_{dis}$ can be an essentially constant current having a value that is lower than the maximum value, for example a current value below the maximum value according to safety margin, such as 5% or 10% or 20% or up to 50% lower than the maximum value.

Discharge current generation circuit 230 may be implemented in accordance with the above discussion as shown in FIGS. 5A to 5D. The discharge current generation circuit 230 of FIGS. 5A to 5D may include a discharge switch 231, which causes discharge current generation circuit 230 to discharge control terminal $100_C$ with the discharge current. Discharge switch 231 may be controlled by one of a gate driver 232 or directly by overcurrent detection signal 240S. Gate driver 232 may be similar to gate driver 224 of control path control circuit 220, e.g., it may couple discharge switch 231 to a supply voltage corresponding to a conducting state of discharge switch 231 and to a supply voltage corresponding to a blocking state of discharge switch 231.

Figures 5A, 5B, 5C:
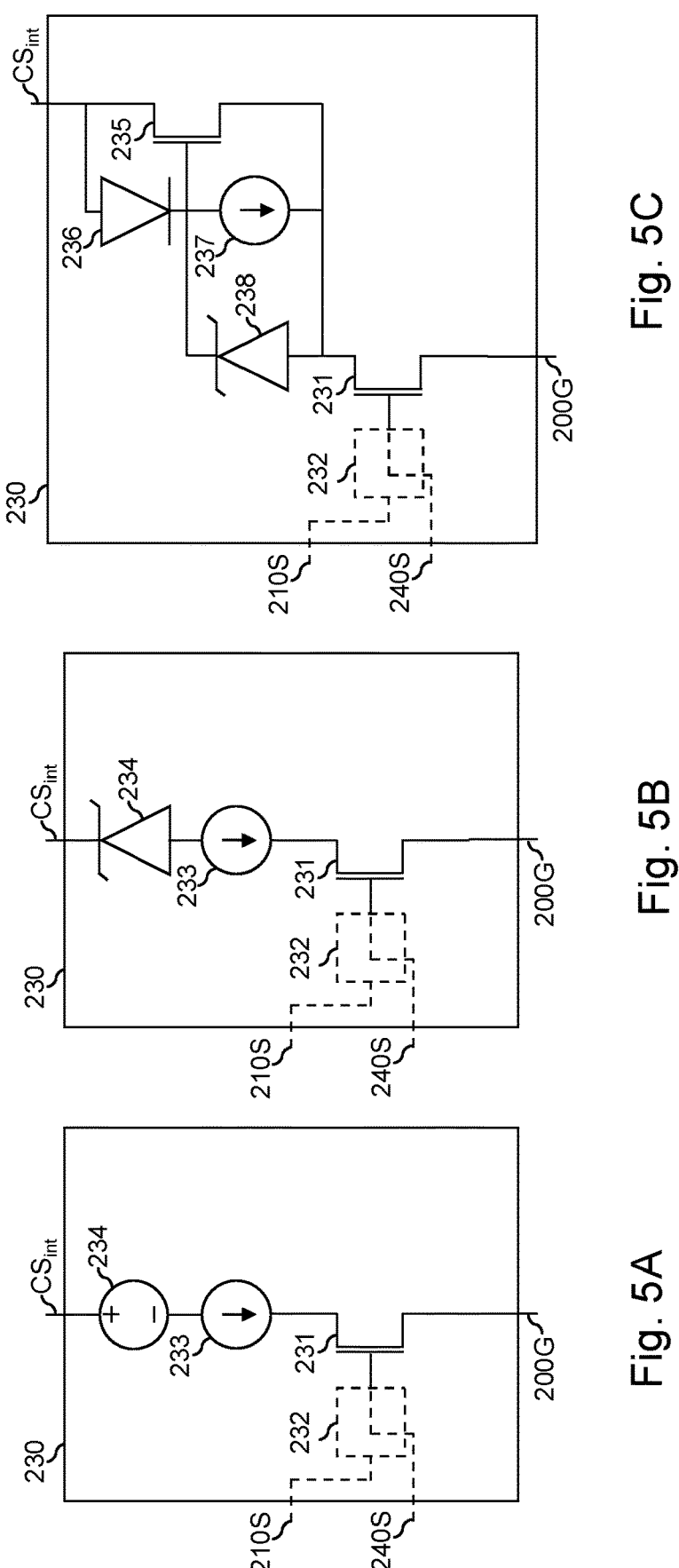
FIGS. 5A to 5D illustrate example implementations of the discharge current generation circuit of the power switch assembly according to implementations of the present implementation.

In the implementation of discharge current generation circuit 230 shown in FIG. 5A, discharge current generation circuit 230 may in addition comprise a current source 233 and a voltage source 234. Current source 233 may provide the above-discussed discharge current. Voltage source 234 may provide voltage $V_{safe}$ discussed above. Since discharge current generation circuit 230 is coupled between control terminal $100_C$ and second load terminal $100_{L2}$ when discharge switch 231 is in the conducting state, voltage source 234 may cause voltage $V_{CL2}$ to be reduced to voltage $V_{safe}$. Voltage source 234 may for example be implemented by a Zener diode 234, as shown in FIG. 5B. Current source 233 may be implemented as shown in FIG. 5C, that is with a current source switch 235, a diode 236, a Zener diode 238 and a biasing current source 237.

As previously discussed, to enable overcurrent handling logic 200 to control the power switch 100 when an overcurrent condition of the load current $I_L$ is detected, control terminal 100C needs to be decoupled from assembly control terminal $T_C$. To this end, switch 221 may be in a conducting state while switch 231 is in a blocking state and vice versa, as indicated by voltages $V_{221}$ and $V_{231}$ in the middle signal diagram of FIG. 6. In some implementations of the present disclosure, such a control of switches 221 and 231 may be achieved based on overcurrent detection signal 240S. In some implementations, such a control of switches 221 and 231 may be achieved based on control path modulation signal 230S, which may be provided by discharge current generation circuit 230 of FIG. 5D.

Figure 5D:
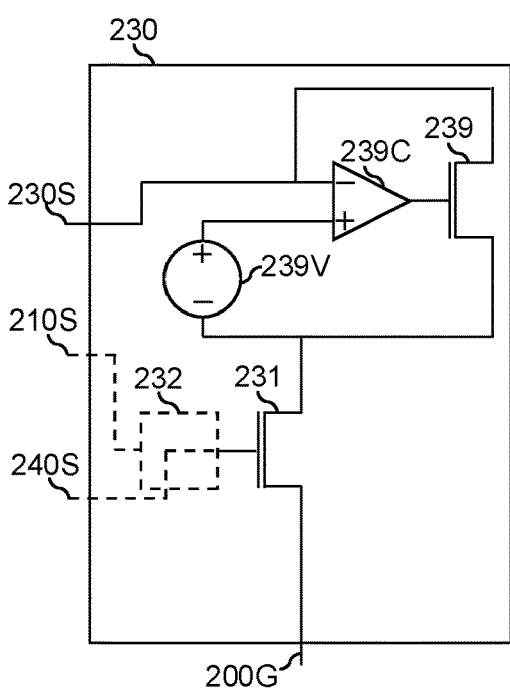

Discharge current generation circuit 230 of FIG. 5D may include voltage source 239V, a voltage comparator 239C and modulation switch 239. Modulation signal 230S is thus based on the voltage at a first load terminal of modulation switch 239. Modulation switch 239 is controlled by the result of the comparison of voltage comparator 239C with the voltage level of control path modulation signal 230S. Control path modulation signal 230S causes the impedance of switch 221 to vary to thereby vary voltage $V_{CL2}$, for example to reduce voltage $V_{CL2}$ to voltage level $V_{safe}$. In other words, control path modulation signal 230S may be used by overcurrent handling logic 200 to perform internal control of power switch 100 by modulating external control signal $CS_{ext}$ based on the impedance of switch 221.

Overcurrent detection circuit 240 is coupled between second load terminal $100_{L2}$ and second assembly load terminal $T_{L2}$ and provides overcurrent detection signal 240S. As will be discussed in the following, overcurrent detection circuit 240 is configured to detect an overcurrent condition of load current $I_L$ and to compensate a temperature coefficient of overcurrent detection circuit 240 in order to prevent erroneous detections of overcurrent conditions. Overcurrent detection signal 240S may thus also be referred to as temperature-compensated overcurrent detection signal 240S.

Power switch 100 may for example be switched at switching frequencies up to the kHz range or even above. Accordingly, overcurrent detection circuit 240 needs to detect an overcurrent condition of load current $I_L$ in a short time frame, such as 100 ns. In order to comply with such a detection speed requirement, overcurrent detection circuit 240 is configured to maintain at least a part of overcurrent detection circuit 240 in a linear operating region during operation of power switch assembly 10. Power switch assembly 10 is in operation while an external gate driver applies a voltage across assembly control terminal $T_C$ and second assembly load terminal $T_{L2}$. The linear operating region refers to an operating region of a semiconductor device, such as a MOSFET or a bipolar junction transistor (BJT), in which the semiconductor device behaves like a voltage-controlled current source. In other words, in the linear operating region a change of the gate voltage of the semiconductor device causes a proportional and essentially instant change of the current through the semiconductor device. Such a behavior enables fast response to a signal, such as a signal indicative of load current $I_L$.

With overcurrent detection circuit 240 maintaining at least a part of overcurrent detection circuit 240 in the linear operating mode, overcurrent detection circuit 240 is further configured to detect an overcurrent condition of load current $I_L$ in a manner complying with the detection speed requirement discussed above. This enables overcurrent detection circuit 240 to compensate a temperature coefficient of the overcurrent detection circuit to provide temperature-compensated overcurrent detection signal 240S while complying with the detection speed requirement. In other words, maintaining at least a part of overcurrent detection circuit 240 in the linear operating mode, enables overcurrent detection circuit 240 to compensate the temperature coefficient without delaying the detection of the overcurrent condition.

For example, as shown in FIG. 2, overcurrent detection circuit 240 may comprise a current measurement resistor 242 resistor coupled between second load terminal $100_{L2}$ and second assembly load terminal $T_{L2}$. Current measurement resistor 242 may have a current measurement temperature coefficient. For example, current measurement resistor 242 may be a copper shunt with a temperature coefficient of $3.9 \times 10^{-3}$ $1/^{\circ}$ C. Further, overcurrent detection circuit 240 may comprise a temperature compensation circuit 241, which is coupled to current measurement resistor 241. Temperature compensation circuit 241 may have a compensation temperature coefficient. The compensation temperature coefficient may be chosen to compensate the current measurement temperature coefficient. For example, the compensation temperature coefficient may be of the same value but have a different sign than the current measurement temperature coefficient or may be of the same sign but arranged in a manner to counteract the current measurement temperature coefficient. In the example of overcurrent detection circuit 240 including temperature compensation circuit 241 and current measurement resistor 242, it is at least a part of temperature compensation circuit 241 which may be maintained in the linear operating region during operation of the power switch assembly.

Figure 7:
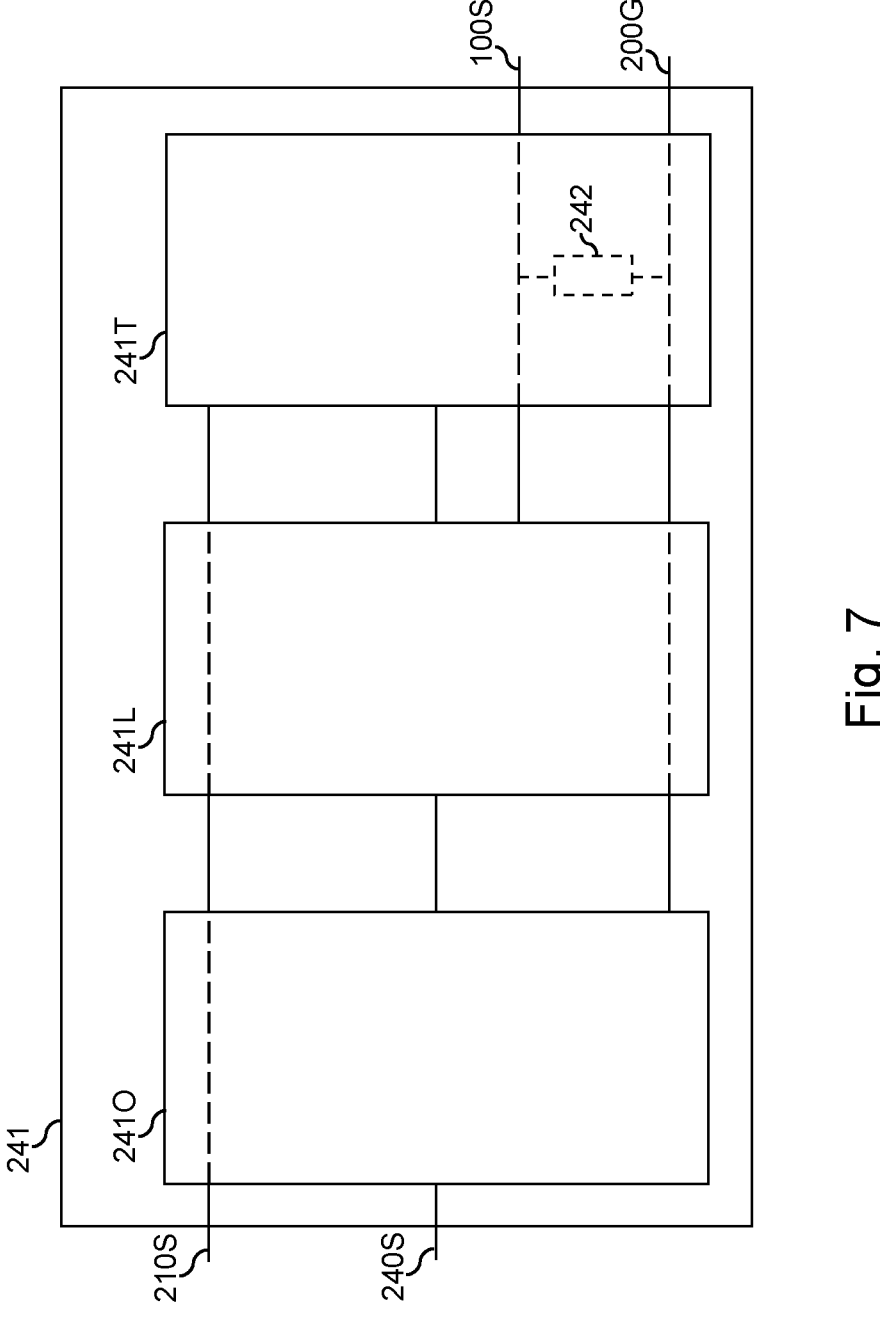
FIG. 7 provides a block diagram of the temperature compensation circuit of the power switch assembly according to implementations of the present implementation.

As illustrated in FIG. 7, temperature compensation circuit 241 may comprise a temperature coefficient compensation circuit 241T, a linear region maintenance and conversion circuit 241L and an overcurrent signal output stage 241O.

Temperature coefficient compensation circuit 241T may be coupled to current measurement resistor 242 and to linear region maintenance and conversion circuit 241L and may have the compensation temperature coefficient. Linear region maintenance and conversion circuit 241L may be coupled to temperature coefficient compensation circuit 241T and to overcurrent signal output stage 241O.

Linear region maintenance and conversion circuit 241L may be configured to maintain at least a part of temperature coefficient compensation circuit 241 T in the linear operating region. Further, linear region maintenance and conversion circuit 241L may also be configured to increase a dynamic range of temperature-compensated overcurrent detection signal 240S.

Overcurrent signal output stage 241O may be coupled to linear region maintenance and conversion circuit 241L and may be configured to provide temperature-compensated overcurrent detection signal 240S based on a comparison of an output of linear region maintenance and conversion circuit 241L with an overcurrent threshold value. The overcurrent threshold value may for example be inherently generated by temperature coefficient compensation circuit 241T. In such implementations of the present disclosure, overcurrent signal output stage 241O may also be coupled to temperature coefficient compensation circuit 241T.

Figure 8:
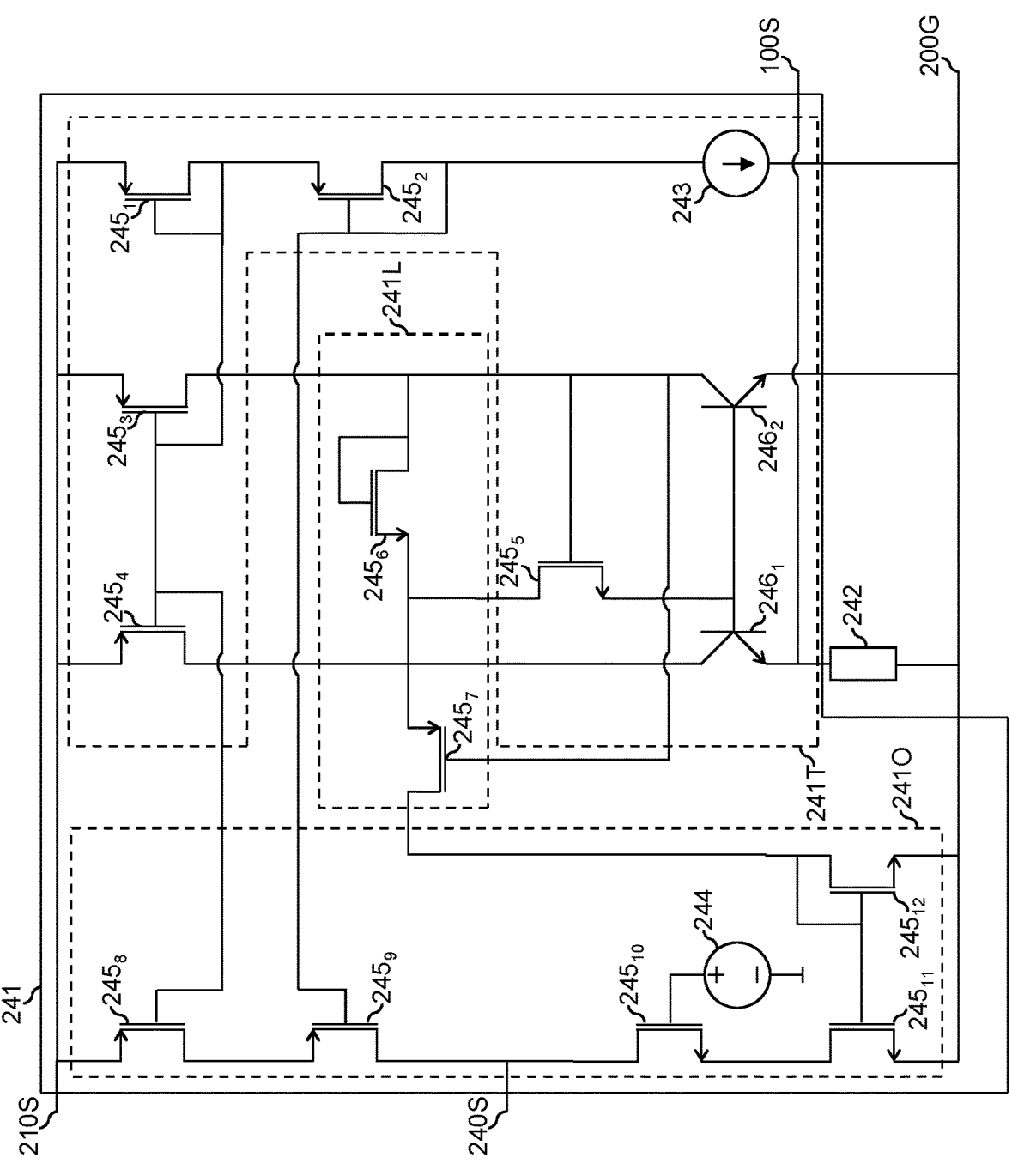
FIG. 8 illustrates an example implementation of the temperature compensation circuit of the power switch assembly according to implementations of the present implementation.

FIG. 8 illustrates a detailed example implementation of temperature compensation circuit 241 and thereby of temperature coefficient compensation circuit 241T, linear region maintenance and conversion circuit 241L and overcurrent signal output stage 241O, which are respectively indicated within FIG. 8 by dashed boxes.

Accordingly, temperature coefficient compensation circuit 241T may include switches $245_1$ to $245_5$, bipolar transistors $246_1$ and $246_2$ and a biasing current source 243. Bipolar transistors $246_1$ and $246_2$ may also be referred to as compensation transistors. Bipolar transistors $246_1$ and $246_2$ may be arranged to cause a voltage drop exhibiting the compensation temperature coefficient at current measurement resistor 242 caused by temperature coefficients of bipolar transistors $246_1$ and $246_2$. This voltage drop may cancel out the current measurement temperature coefficient of resistor 242. Based on the voltage drop, the signal indicative of load current IL may thus be temperature-compensated, which may lead to overcurrent detection signal 240S being temperature-compensated.

Linear region maintenance and conversion circuit 241L may comprise switches $245_6$ and $245_7$. Switch $245_6$ is arranged with regard to bipolar transistor $256_1$ to maintain bipolar transistor $256_1$ in the linear operating region. In the implementation of temperature compensation circuit 241 of FIG. 8, the temperature-compensated signal indicative of load current $I_L$ is initially provided as a voltage signal at the signal line between bipolar transistors $246_1$ and $246_2$. Switch $245_7$ may be arranged to convert this voltage signal to a current signal indicative of load current $I_L$. Together with the conversion, switch $245_7$ may increase the dynamic range of the temperature-compensated signal indicative of load current $I_L$.

Overcurrent signal output stage 241O may comprise switches $245_8$ to $245_{12}$ and a biasing voltage source 244. Switches $245_{11}$ and $245_{12}$ may form a current mirror mirroring the current signal indicative of load current $I_L$. Transistors $245_8$ and $245_9$ may be coupled to temperature coefficient compensation circuit 241T to receive the overcurrent threshold value and accordingly couple the output of overcurrent signal output stage 241O to power supply line 210S if the current signal indicative of load current $I_L$ is indicative of an overcurrent condition of load current $I_L$.

FIG. 9 provides a flowchart of a method 300 for operating overcurrent handling logic 200. Optional steps of method 300 are illustrated as dashed boxes in FIG. 9.

In step 310, method 300 may maintain at least a part of overcurrent detection logic 200 in the linear operating region during operation of power switch assembly 10.

In step 320, method 300 detects an overcurrent condition at second load terminal $100_{L2}$ to provide overcurrent detection signal 240S.

In step 330, method 300 may compensate the temperature coefficient of overcurrent detection circuit 240 to provide temperature-compensated overcurrent detection signal 240S.

In step 340, method 300 generates the discharge current.

In step 350, method 300 at least partially discharges control terminal $100_C$ responsive to temperature-compensated overcurrent detection signal 240S with the discharge current.

While the above discussion of FIGS. 2 to 9 has described overcurrent handling logic as comprising both the temperature compensation of the overcurrent detection signal and the discharge current generation providing a fast fall time $t_{fall}$ while avoiding a damaging voltage surge, it will be understood that both aspects may be practiced independently of one another. That is, in some implementations of the present disclosure, power switch assembly 10 may only include the temperature-compensated overcurrent detection and use other means of internally controlling power switch 100 upon detection of an overcurrent condition. In some implementations of the present disclosure, power switch assembly 10 may only include the discharge current generation discussed herein and may rely on other means of internal overcurrent detection.

ASPECTS

The implementation may further be illustrated by the following aspects.

In an aspect, a power switch assembly having an assembly control terminal, a first assembly load terminal and a second assembly load terminal, may comprise a power switch having a control terminal coupled to the assembly control terminal, a first load terminal coupled to the first assembly load terminal and a second load terminal coupled to the second assembly load terminal, and an overcurrent handling logic coupled between the assembly control terminal and the control terminal and between the second load terminal and the second assembly load terminal, including an overcurrent detection circuit coupled between the second load terminal and the second assembly load terminal and configured to provide an overcurrent detection signal indicative of an overcurrent condition of a load current of the power switch, and a discharge current generation circuit coupled to the overcurrent detection circuit and the control terminal and configured to generate a discharge current to at least partially discharge the control terminal responsive to the overcurrent detection signal.

In an aspect, the power switch assembly may further comprise a package configured to enclose the overcurrent handling logic and the power switch, wherein the package comprises the assembly control terminal, the first assembly load terminal and the second assembly load terminal. In an implementation, the package exclusively comprises the assembly control terminal, the first assembly load terminal and the second assembly load terminal and no other or further terminals.

In an aspect, the discharge current may be based on a fall time, wherein the fall time defines a timeframe from the detection of the overcurrent to a reduction of the load current to a safety load current value.

In an aspect, the overcurrent handling logic may further comprise a control path control circuit coupled between the assembly control terminal and the control terminal, and the control path control circuit may further be configured to switchably couple the assembly control terminal to the control terminal.

In an aspect, the control path control circuit may be configured to decouple the assembly control terminal from the control terminal responsive to the overcurrent detection signal.

In an aspect, the control path control circuit may further be configured to keep or maintain the assembly control terminal decoupled from the control terminal until a voltage supplied by a gate driver coupled to the assembly control terminal and the second assembly load terminal falls below a threshold voltage of the power switch.

In an aspect, the discharge current generation circuit may be configured to generate the discharge current such that the control terminal is discharged until the load current reaches or falls below a safety load current value.

In an aspect, the overcurrent detection circuit may be configured to compensate a temperature coefficient of the overcurrent detection circuit to provide a temperature-compensated overcurrent detection signal.

In an aspect, the overcurrent detection circuit may comprise a current measurement resistor coupled between the second load terminal and the second assembly load terminal, wherein the current measurement resistor has a current measurement temperature coefficient, and a temperature compensation circuit coupled to the current measurement resistor, wherein the temperature compensation circuit has a compensation temperature coefficient, and wherein the compensation temperature coefficient may be configured to compensate the current measurement temperature coefficient.

In an aspect, the overcurrent detection circuit may be configured to maintain at least a part of the overcurrent detection circuit in a linear operating region during operation of the power switch assembly.

In an aspect, at least a part of the temperature compensation circuit may be maintained in the linear operating region during operation of the power switch assembly.

In an aspect, the temperature compensation circuit may comprise a temperature coefficient compensation circuit having the compensation temperature coefficient; and a linear region maintenance and conversion circuit coupled to the temperature coefficient compensation circuit and configured to maintain at least a part of the temperature coefficient compensation circuit in the linear operating region.

In an aspect, the temperature compensation circuit may further comprise an overcurrent signal output stage coupled to the linear region maintenance and conversion circuit and configured to provide the temperature-compensated overcurrent detection signal based on a comparison of an output of the linear region maintenance and conversion circuit with an overcurrent threshold value.

In an aspect, the temperature coefficient compensation circuit may include at least one compensation transistor having the compensation temperature coefficient, and the at least one compensation transistor may be maintained in the linear operating region.

In an aspect, the linear region maintenance and conversion circuit may further be configured to increase a dynamic range of the temperature-compensated overcurrent detection signal.

In an aspect, the overcurrent handling logic may further comprise a power supply generation circuit configured to generate a power supply for at least one of the overcurrent detection circuit, the discharge current generation circuit and the control path control circuit based on a voltage supplied by a gate driver coupled to the assembly control terminal and the second assembly load terminal.

In an aspect, a method for operating an overcurrent handling logic of a power switch assembly, the overcurrent handling logic comprising an overcurrent detection logic and a discharge current generation circuit, the method comprising detecting an overcurrent condition at a second load terminal of a load current of the power switch to provide an overcurrent detection signal indicative of the overcurrent condition of the load current of the power switch, and generating a discharge current, and at least partially discharging a control terminal of the power switch with the discharge current responsive to the overcurrent detection signal.

In an aspect, the method may further comprise maintaining at least a part of the overcurrent detection logic in a linear operating region during operation of the power switch assembly.

In an aspect, the method may further comprise compensating a temperature coefficient of the overcurrent detection circuit to provide a temperature-compensated overcurrent detection signal.

In an aspect, a power switch assembly having an assembly control terminal, a first assembly load terminal and a second assembly load terminal, may comprise a power switch having a control terminal coupled to the assembly control terminal, a first load terminal coupled to the first assembly load terminal and a second load terminal coupled to the second assembly load terminal, and an overcurrent handling logic coupled between the assembly control terminal and the control terminal and between the second load terminal and the second assembly load terminal, including an overcurrent detection circuit coupled between the second load terminal and the second assembly load terminal and configured to detect an overcurrent condition of a load current of the power switch, and compensate a temperature coefficient of the overcurrent detection circuit to provide a temperature-compensated overcurrent detection signal, wherein the compensation of the temperature coefficient does not delay the detection of the overcurrent condition, and a discharge current generation circuit coupled to the overcurrent detection circuit and the control terminal and configured to generate a discharge current to discharge the control terminal responsive to the temperature-compensated overcurrent detection signal.

In an aspect, a power switch assembly having an assembly control terminal, a first assembly load terminal and a second assembly load terminal, may comprise a power switch having a control terminal coupled to the assembly control terminal, a first load terminal coupled to the first assembly load terminal and a second load terminal coupled to the second assembly load terminal, and an overcurrent handling logic coupled between the assembly control terminal and the control terminal and between the second load terminal and the second assembly load terminal, including an overcurrent detection circuit coupled between the second load terminal and the second assembly load terminal and configured to maintain at least a part of the overcurrent detection circuit in a linear operating region during operation of the power switch assembly, detect an overcurrent condition of a load current of the power switch, and compensate a temperature coefficient of the overcurrent detection circuit to provide a temperature-compensated overcurrent detection signal, and a control terminal control circuit coupled to the overcurrent detection circuit and the control terminal and configured to control the control terminal responsive to the temperature-compensated overcurrent detection signal.

In an aspect, a power switch assembly having an assembly control terminal, a first assembly load terminal and a second assembly load terminal, comprises a power switch having a control terminal coupled to the assembly control terminal, a first load terminal coupled to the first assembly load terminal and a second load terminal coupled to the second assembly load terminal, and an overcurrent handling logic coupled between the assembly control terminal and the control terminal and between the second load terminal and the second assembly load terminal, including an overcurrent detection circuit coupled between the second load terminal and the second assembly load terminal and configured to maintain at least a part of the overcurrent detection circuit in a linear operating region during operation of the power switch assembly, detect an overcurrent condition of a load current of the power switch, and compensate a temperature coefficient of the overcurrent detection circuit to provide a temperature-compensated overcurrent detection signal, and a discharge current generation circuit coupled to the overcurrent detection circuit, the control terminal and the second load terminal and configured to generate a discharge current to at least partially discharge the control terminal responsive to the temperature-compensated overcurrent detection signal.

The preceding description has been provided to illustrate a power switch assembly including an overcurrent handling logic. It should be understood that the description is in no way meant to limit the scope of the implementation to the precise implementations discussed throughout the description. Rather, the person skilled in the art will be aware that these implementations may be combined, modified or condensed without departing from the scope of the implementation as defined by the following claims.

The invention claimed is:

1. A power switch assembly having an assembly control terminal, a first assembly load terminal, and a second assembly load terminal, comprising:

a power switch having a control terminal coupled to the assembly control terminal, a first load terminal coupled to the first assembly load terminal, and a second load terminal coupled to the second assembly load terminal; and overcurrent handling logic coupled between the assembly control terminal and the control terminal and between the second load terminal and the second assembly load terminal, the overcurrent handling logic including:

an overcurrent detection circuit coupled between the second load terminal and the second assembly load terminal and configured to detect an overcurrent condition of a load current of the power switch and to provide an overcurrent detection signal indicative of the overcurrent condition of the load current of the power switch; and a discharge current generation circuit coupled to the overcurrent detection circuit, the control terminal, and the second load terminal, wherein the discharge current generation circuit is configured to generate a discharge current to at least partially discharge the control terminal responsive to the overcurrent detection signal, wherein the overcurrent handling logic further comprises a control path control circuit coupled between the assembly control terminal and the control terminal, wherein the control path control circuit is configured to switchably couple the assembly control terminal to the control terminal, wherein the control path control circuit is configured to decouple the assembly control terminal from the control terminal responsive to the overcurrent detection signal, and wherein the control path control circuit is further configured to maintain the assembly control terminal decoupled from the control terminal until a voltage supplied by a gate driver coupled to the assembly control terminal and the second assembly load terminal falls below a threshold voltage of the power switch.

2. The power switch assembly of claim 1, further comprising:

a package configured to enclose the overcurrent handling logic and the power switch, wherein the package comprises the assembly control terminal, the first assembly load terminal, and the second assembly load terminal.

3. The power switch assembly of claim 1, wherein the discharge current is based on a fall time, wherein the fall time defines a timeframe from the detection of the overcurrent condition to a reduction of the load current to a safety load current value.

4. The power switch assembly of claim 1, wherein the discharge current generation circuit is configured to generate the discharge current such that the control terminal is discharged until the load current reaches or falls below a safety load current value.

5. The power switch assembly of claim 1, wherein the overcurrent detection circuit is configured to compensate a temperature coefficient of the overcurrent detection circuit to provide a temperature-compensated overcurrent detection signal.

6. The power switch assembly of claim 5, wherein the overcurrent detection circuit comprises:

a current measurement resistor coupled between the second load terminal and the second assembly load terminal, wherein the current measurement resistor has a current measurement temperature coefficient; and a temperature compensation circuit coupled to the current measurement resistor, wherein the temperature compensation circuit has a compensation temperature coefficient, and wherein the compensation temperature coefficient is configured to compensate for the current measurement temperature coefficient.

7. The power switch assembly of claim 5, wherein the overcurrent detection circuit is configured to maintain at least a part of the overcurrent detection circuit in a linear operating region during operation of the power switch assembly.

8. A power switch assembly having an assembly control terminal, a first assembly load terminal, and a second assembly load terminal, comprising:

a power switch having a control terminal coupled to the assembly control terminal, a first load terminal coupled to the first assembly load terminal, and a second load terminal coupled to the second assembly load terminal; and overcurrent handling logic coupled between the assembly control terminal and the control terminal and between the second load terminal and the second assembly load terminal, the overcurrent handling logic including:

an overcurrent detection circuit coupled between the second load terminal and the second assembly load terminal and configured to detect an overcurrent condition of a load current of the power switch and to provide an overcurrent detection signal indicative of the overcurrent condition of the load current of the power switch; and a discharge current generation circuit coupled to the overcurrent detection circuit, the control terminal, and the second load terminal, wherein the discharge current generation circuit is configured to generate a discharge current to at least partially discharge the control terminal responsive to the overcurrent detection signal, wherein the overcurrent detection circuit is configured to compensate a temperature coefficient of the overcurrent detection circuit to provide a temperature-compensated overcurrent detection signal, wherein the overcurrent detection circuit comprises:

a current measurement resistor coupled between the second load terminal and the second assembly load terminal, wherein the current measurement resistor has a current measurement temperature coefficient; and a temperature compensation circuit coupled to the current measurement resistor, wherein the temperature compensation circuit has a compensation temperature coefficient, and wherein the compensation temperature coefficient is configured to compensate for the current measurement temperature coefficient, wherein the temperature compensation circuit comprises:

a temperature coefficient compensation circuit having the compensation temperature coefficient; and a linear region maintenance and conversion circuit coupled to the temperature coefficient compensation circuit and configured to maintain at least a part of the temperature coefficient compensation circuit in a linear operating region.

9. The power switch assembly of claim 8, wherein:

the temperature compensation circuit further comprises an overcurrent signal output stage coupled to the linear region maintenance and conversion circuit and configured to provide the temperature-compensated overcurrent detection signal based on a comparison of an output of the linear region maintenance and conversion circuit with an overcurrent threshold value.

10. A power switch assembly having an assembly control terminal, a first assembly load terminal, and a second assembly load terminal, comprising:

a power switch having a control terminal coupled to the assembly control terminal, a first load terminal coupled to the first assembly load terminal, and a second load terminal coupled to the second assembly load terminal; and overcurrent handling logic coupled between the assembly control terminal and the control terminal and between the second load terminal and the second assembly load terminal, the overcurrent handling logic including:

an overcurrent detection circuit coupled between the second load terminal and the second assembly load terminal and configured to detect an overcurrent condition of a load current of the power switch and to provide an overcurrent detection signal indicative of the overcurrent condition of the load current of the power switch; and a discharge current generation circuit coupled to the overcurrent detection circuit, the control terminal, and the second load terminal, wherein the discharge current generation circuit is configured to generate a discharge current to at least partially discharge the control terminal responsive to the overcurrent detection signal, wherein the overcurrent detection circuit is configured to compensate a temperature coefficient of the overcurrent detection circuit to provide a temperature-compensated overcurrent detection signal, wherein the overcurrent detection circuit comprises:

a current measurement resistor coupled between the second load terminal and the second assembly load terminal, wherein the current measurement resistor has a current measurement temperature coefficient; and a temperature compensation circuit coupled to the current measurement resistor, wherein the temperature compensation circuit has a compensation temperature coefficient, and wherein the compensation temperature coefficient is configured to compensate for the current measurement temperature coefficient, wherein the temperature coefficient compensation circuit includes at least one compensation transistor having the compensation temperature coefficient, and wherein the at least one compensation transistor is maintained in a linear operating region.

11. The power switch assembly of claim 8, wherein:

the linear region maintenance and conversion circuit is further configured to increase a dynamic range of the temperature-compensated overcurrent detection signal.

12. A method for operating overcurrent handling logic of a power switch assembly having an assembly control terminal, a first assembly load terminal, and a second assembly load terminal, the overcurrent handling logic comprising an overcurrent detection logic and a discharge current generation circuit, the method comprising:

detecting an overcurrent condition of a load current at a second load terminal of a power switch to provide an overcurrent detection signal indicative of the overcurrent condition of the load current of the power switch; and at least partially discharging a control terminal of the power switch with the discharge current responsive to the overcurrent detection signal, switchably coupling the assembly control terminal to the control terminal, including decoupling the assembly control terminal from the control terminal responsive to the overcurrent detection signal and maintaining the assembly control terminal decoupled from the control terminal until a voltage supplied by a gate driver coupled to the assembly control terminal and the second assembly load terminal falls below a threshold voltage of the power switch.

13. The method of claim 12, further comprising:

maintaining one or more semiconductor devices of the overcurrent detection logic in a linear operating region during operation of the power switch assembly.

14. The method of claim 12, further comprising:

compensating a temperature coefficient of the overcurrent detection circuit to provide a temperature-compensated overcurrent detection signal.

15. A power switch assembly having an assembly control terminal, a first assembly load terminal, and a second assembly load terminal, the power switch assembly comprising:

a power switch having a control terminal coupled to the assembly control terminal, a first load terminal coupled to the first assembly load terminal, and a second load terminal coupled to the second assembly load terminal; and overcurrent handling logic coupled between the assembly control terminal and the control terminal and between the second load terminal and the second assembly load terminal, the overcurrent handling logic including:

an overcurrent detection circuit coupled between the second load terminal and the second assembly load terminal and configured to detect an overcurrent condition of a load current of the power switch, and compensate, using compensation transistors having respective temperature coefficients, a temperature coefficient of the overcurrent detection circuit to provide a temperature-compensated overcurrent detection signal, wherein the compensation of the temperature coefficient using the compensation transistors does not delay the detection of the overcurrent condition; and a discharge current generation circuit coupled to the overcurrent detection circuit and the control terminal, wherein the discharge current generation circuit is configured to generate a discharge current to discharge the control terminal responsive to the temperature-compensated overcurrent detection signal.

16. A power switch assembly having an assembly control terminal, a first assembly load terminal, and a second assembly load terminal, the power switch assembly comprising:

a power switch having a control terminal coupled to the assembly control terminal, a first load terminal coupled to the first assembly load terminal, and a second load terminal coupled to the second assembly load terminal; and overcurrent handling logic coupled between the assembly control terminal and the control terminal and between the second load terminal and the second assembly load terminal, the overcurrent handling logic including:

an overcurrent detection circuit coupled between the second load terminal and the second assembly load terminal and configured to maintain one or more semiconductor devices of the overcurrent detection circuit in a linear operating region during operation of the power switch assembly, detect an overcurrent condition of a load current of the power switch, and compensate a temperature coefficient of the overcurrent detection circuit to provide a temperature-compensated overcurrent detection signal; and a control terminal control circuit coupled to the overcurrent detection circuit and the control terminal, wherein the control terminal control circuit is configured to control the control terminal responsive to the temperature-compensated overcurrent detection signal.

17. A power switch assembly having an assembly control terminal, a first assembly load terminal, and a second assembly load terminal, the power switch assembly comprising:

a power switch having a control terminal coupled to the assembly control terminal, a first load terminal coupled to the first assembly load terminal, and a second load terminal coupled to the second assembly load terminal; and overcurrent handling logic coupled between the assembly control terminal and the control terminal and between the second load terminal and the second assembly load terminal, the overcurrent handling logic including:

an overcurrent detection circuit coupled between the second load terminal and the second assembly load terminal and configured to maintain one or more semiconductor devices of the overcurrent detection circuit in a linear operating region during operation of the power switch assembly, detect an overcurrent condition of a load current of the power switch, and compensate a temperature coefficient of the overcurrent detection circuit to provide a temperature-compensated overcurrent detection signal; and a discharge current generation circuit coupled to the overcurrent detection circuit, the control terminal, and the second load terminal, wherein the discharge current generation circuit is configured to generate a discharge current to at least partially discharge the control terminal responsive to the temperature-compensated overcurrent detection signal.

* * * * *